United States Patent
Yamaguchi et al.

(10) Patent No.: US 7,795,621 B2
(45) Date of Patent: Sep. 14, 2010

(54) THIN FILM TRANSISTOR PANEL

(75) Inventors: Ikuhiro Yamaguchi, Tokyo (JP);
Manabu Takei, Sagamihara (JP);
Motohiko Yoshida, Fussa (JP)

(73) Assignee: Casio Computer Co., Ltd., Tokyo (JP)

( * ) Notice: Subject to any disclaimer, the term of this patent is extended or adjusted under 35 U.S.C. 154(b) by 190 days.

(21) Appl. No.: 11/356,407

(22) Filed: Feb. 16, 2006

(65) Prior Publication Data

US 2006/0192204 A1    Aug. 31, 2006

(30) Foreign Application Priority Data

Feb. 28, 2005    (JP)    ............... 2005-054403

(51) Int. Cl.
*H01L 29/10* (2006.01)
*H01L 29/786* (2006.01)
(52) U.S. Cl. ............... 257/72; 257/435; 257/66; 257/E29.282
(58) Field of Classification Search ............ 257/59, 257/57, E29.147, E29.28–29, E21.411, E27.111, 257/72, 435, 66
See application file for complete search history.

(56) References Cited

U.S. PATENT DOCUMENTS

| 5,345,324 | A   | 9/1994  | Koseki et al. |         |
|-----------|-----|---------|---------------|---------|
| 5,510,916 | A   | 4/1996  | Takahashi     |         |
| 5,744,864 | A   | 4/1998  | Cillessen et al. |      |
| 6,040,882 | A   | 3/2000  | Jun et al.    |         |
| 6,069,370 | A * | 5/2000  | Hayama et al. | 257/59  |
| 6,303,963 | B1* | 10/2001 | Ohtani et al. | 257/350 |
| 6,509,616 | B2  | 1/2003  | Yamazaki      |         |
| 6,610,997 | B2  | 8/2003  | Murade        |         |

(Continued)

FOREIGN PATENT DOCUMENTS

CN    1079826 A    12/1993

(Continued)

OTHER PUBLICATIONS

Notification Concerning Transmittal of International Preliminary Report on Patentability, Chapter I of the Patent Cooperation Treaty, and Written Opinion of the International Searching Authority, dated Sep. 11, 2007, for PCT/JP2006/303348 8 sheets.

(Continued)

*Primary Examiner*—Zandra Smith
*Assistant Examiner*—Tsz K Chiu
(74) *Attorney, Agent, or Firm*—Frishauf, Holtz, Goodman & Chick, P.C.

(57) ABSTRACT

A thin film transistor panel including: a transparent substrate; scanning lines made of a light blocking electroconductive material to be formed on the transparent substrate; data lines formed on the transparent substrate to be perpendicular to the scanning lines and made of a light blocking electroconductive material; thin film transistors, each provided with a transparent gate electrode connected to one of the scanning lines, a transparent drain electrode connected to one of the data lines, a transparent source electrode and a transparent semiconductor thin film; and transparent pixel electrodes connected to the thin film transistors, wherein each of the pixel electrodes is formed to cover at least a part of the gate electrode of each of the thin film transistors.

11 Claims, 6 Drawing Sheets

U.S. PATENT DOCUMENTS

| | | | |
|---|---|---|---|
| 6,674,495 B1 * | 1/2004 | Hong et al. | 349/43 |
| 6,713,785 B2 * | 3/2004 | Yagi | 257/59 |
| 7,319,239 B2 | 1/2008 | Tsubata et al. | |
| 7,495,387 B2 * | 2/2009 | Hayashi et al. | 313/505 |
| 7,633,090 B2 * | 12/2009 | Ishii | 257/72 |
| 2002/0063810 A1 | 5/2002 | Nakajima | |
| 2002/0058362 A1 | 6/2002 | Ohtani et al. | |
| 2003/0111663 A1 | 6/2003 | Yagi | |
| 2003/0168688 A1 | 9/2003 | Ohtani et al. | |
| 2003/0203545 A1 | 10/2003 | Hamada et al. | |
| 2003/0218221 A1 | 11/2003 | Wager, III et al. | |
| 2003/0218222 A1 | 11/2003 | Wager, III et al. | |
| 2004/0155270 A1 | 8/2004 | Hoffman | |
| 2004/0155846 A1 | 8/2004 | Hoffman et al. | |
| 2005/0001945 A1 | 1/2005 | Iki | |
| 2006/0033108 A1 | 2/2006 | Hoffman | |
| 2006/0194500 A1 | 8/2006 | Ishii | |

FOREIGN PATENT DOCUMENTS

| | | |
|---|---|---|
| EP | 0 595 363 A1 | 5/1994 |
| JP | 2003-050405 A | 2/2003 |
| JP | 2003-243154 A | 8/2003 |
| JP | 2004-014982 A | 1/2004 |

OTHER PUBLICATIONS

Ohta, H. et al., "Frontier of Transparent Oxide Semiconductor" solid State Electronics, Elsevier Science Publishers, Barking, GB, vol. 47, No. 12, Dec. 2003, pp. 2261-2267, XP004464944, ISSN: 0038-1101.

Related U.S. Appl. No. 11/357,595, filed Feb. 17, 2006; Inventor: H. Ishii.

Chinese Office Action dated Apr. 10, 2009 (6 pages), and English translation thereof (5 pages), issued in counterpart Chinese Application Serial No. 200680000175.6.

Japanese Office Action dated Sep. 29, 2009 and English translation thereof issued in counterpart Japanese Application No. 2005-054402 of related U.S. Appl. No. 11/357,595.

Chinese Office Action dated Sep. 25, 2009 and English translation thereof issued in a counterpart Chinese Application No. 200680006042X of related U.S. Appl. No. 11/357,595.

* cited by examiner

THIN FILM TRANSISTOR PANEL

FIELD OF THE INVENTION

The present invention relates to a thin film transistor panel.

DESCRIPTION OF RELATED ART

As a thin film transistor panel in a liquid crystal display device, an active matrix type thin film transistor panel has been known. In the active matrix type thin film transistor panel, numerous scanning lines and numerous data lines are formed on a substrate in a manner of extending in directions in which the scanning lines and the data lines are perpendicular to each other. In each region enclosed by a couple of scanning lines and a couple of data lines, a pixel electrode and a thin film transistor as a switching element are formed. Each pixel electrode is connected to a corresponding scanning line and a corresponding data line through a thin film transistor. Thus, display pixels are formed in a matrix. Moreover, JP 2003-50405 A discloses a method of reducing manufacturing processes by applying a transparent material such as zinc oxide or the like onto a semiconductor layer of a thin film transistor to integrally form the semiconductor layer and a transparent pixel electrode with the same material. In this case, the pixel electrode is made of a semiconductor material including impurities, and is formed on the same layer as that of the semiconductor thin film of the thin film transistor in the manner of being connected to the semiconductor thin film. The gate electrode of the thin film transistor, the scanning line connected to the gate electrode, and source and drain electrodes are formed with a light blocking electroconductive material, such as an aluminum alloy or the like.

Because the gate electrode and source and drain electrodes of a thin film transistor in the conventional thin film transistor panel are formed with a light blocking electroconductive material, the portion of the gate electrode does not contribute to the opening ratio of the pixel, and consequently the conventional thin film transistor panel has a problem in which the opening ratio is small.

SUMMARY OF THE INVENTION

Accordingly, it is an object of the present invention to provide a thin film transistor panel capable of reducing the manufacturing processes and of having a larger opening ratio thereof.

In order to achieve the above-described object, according to an aspect of the invention, the thin film transistor panel comprises: a transparent substrate (1); scanning lines (2) made of a light blocking electroconductive material to be formed on the transparent substrate (1); data lines (3) formed on the transparent substrate (1) to be perpendicular to the scanning lines (2) and made of a light blocking electroconductive material; thin film transistors (5), each provided with a transparent gate electrode (11) connected to one of the scanning lines (2), a transparent drain electrode (16) connected to one of the data lines (3), a transparent source electrode (15) and a transparent semiconductor thin film (13); and transparent pixel electrodes (4) connected to the thin film transistors (5), wherein each of the pixel electrodes (4) is formed to cover at least a part of the gate electrode (11) of each of the thin film transistors (5).

DETAILED DESCRIPTION OF THE PREFERRED EMBODIMENTS

First Embodiment

Figure 1:
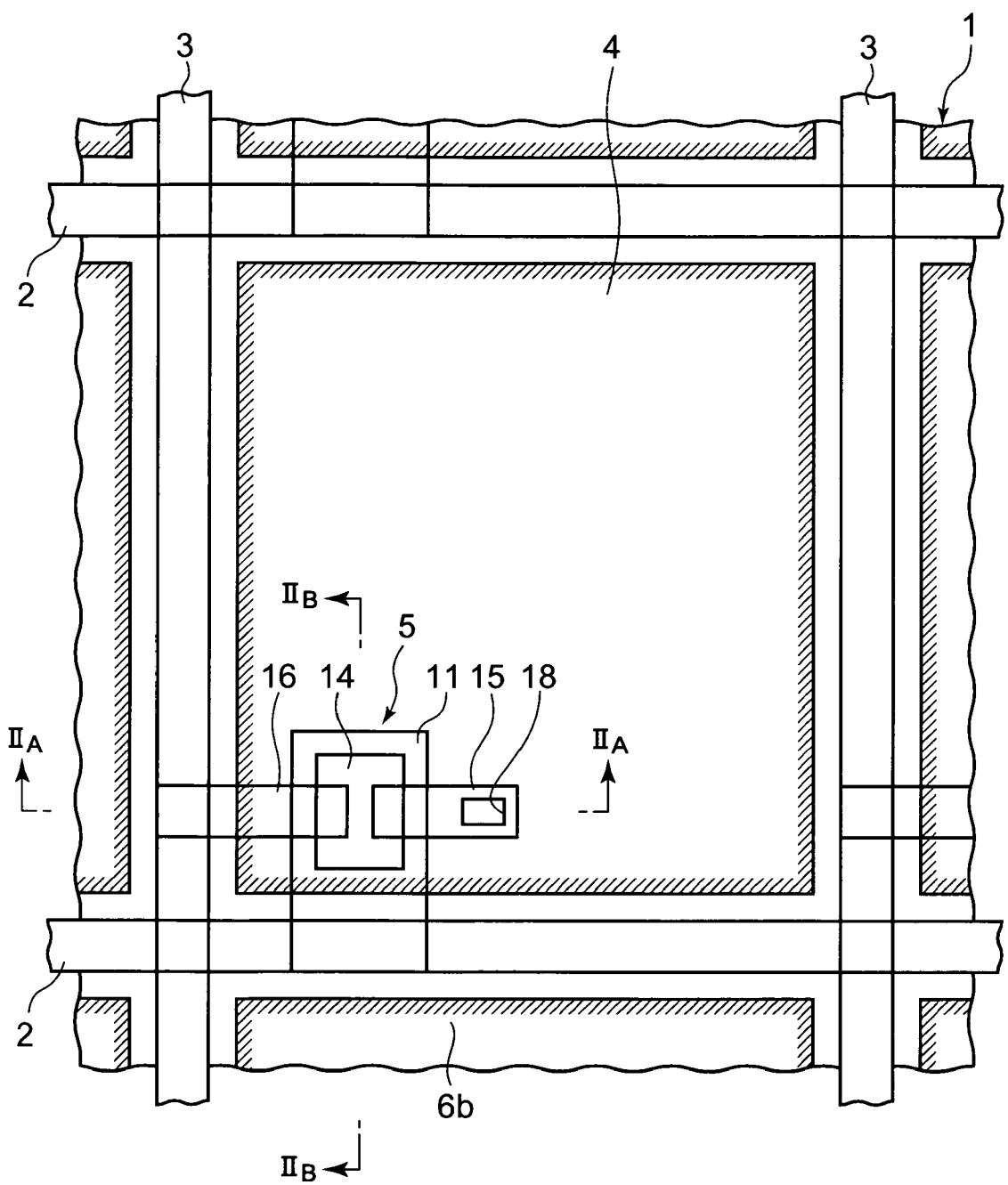
FIG. 1 is a plan view of the principal part of a thin film transistor panel in a liquid crystal display device as a first embodiment of the invention.
Figure 2A:
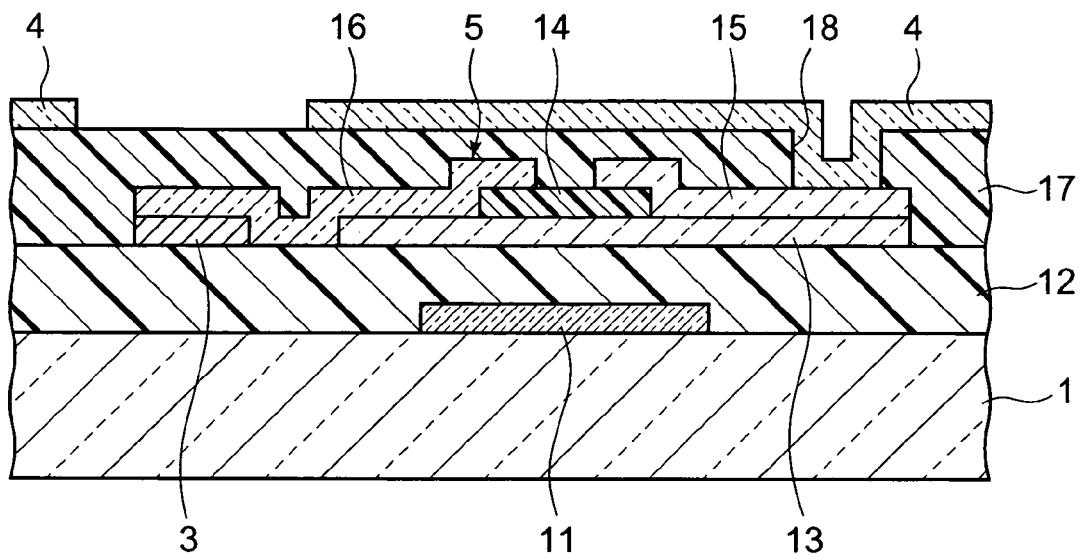
FIG. 2A is a sectional view taken along a line $II_A$-$II_A$ in FIG. 1.
Figure 2B:
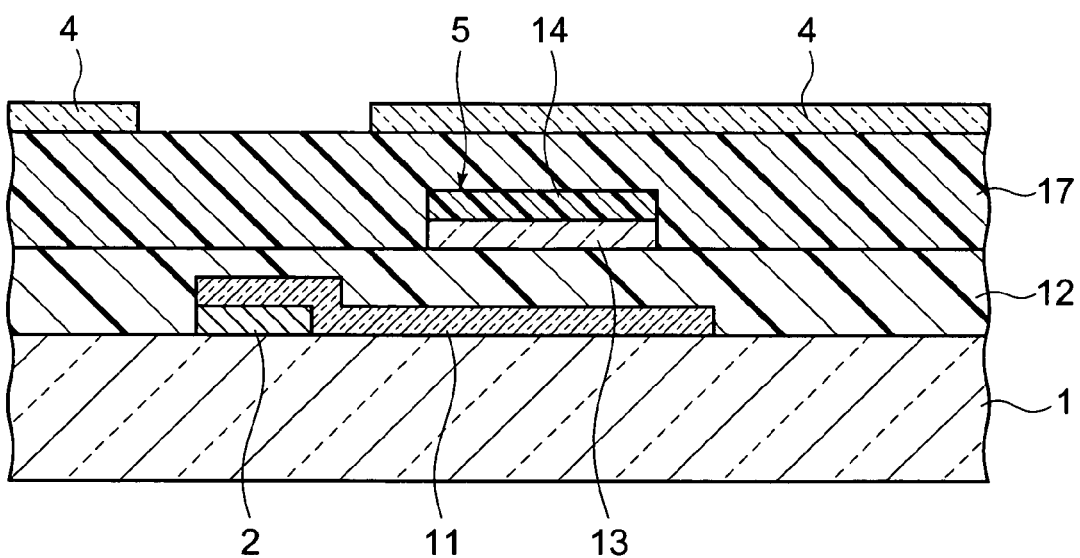
FIG. 2B is a sectional view taken along a line $II_B$-$II_B$ in FIG. 1.

FIG. 1 shows a plan view of the principal part of a thin film transistor panel in a liquid crystal display device as a first embodiment of the present invention. FIG. 2A shows a sectional view taken along a line $II_A$-$II_A$ in FIG. 1, and FIG. 2B shows a sectional view taken along a line $II_B$-$II_B$ in FIG. 1. The thin film transistor panel is provided with a glass substrate 1.

First, a description is given by referring to FIG. 1. Numerous scanning lines 2 and numerous data lines 3 are formed on the top face side of the glass substrate 1 to be extended in directions to cross with each other at right angles. A display element including a thin film transistor 5 connected to one corresponding scanning line 2 and one corresponding data line 3, and a pixel electrode 4 electrically connected to the thin film transistor 5 is arranged in each region enclosed by both the lines 2 and 3. The regions are arranged in a matrix. Here, with an object of clarifying FIG. 1, the edge portions of the pixel electrodes 4 are hatched by oblique short solid lines.

In this case, each of the square-like pixel electrodes 4 is arranged in each of the square-like regions enclosed by the scanning lines 2 and the data lines 3 in the state in which the pixel electrode 4 is positioned as near as possible to the scanning lines 2 and the data lines 3. Each of the thin film transistors 5 is arranged on the under side in the lower left corner part of each of the pixel electrodes 4 in FIG. 1, and almost the whole part of the thin film transistor 5 is covered by the pixel electrode 4.

Next, the concrete structure of the thin film transistor panel is described by referring to FIGS. 2A and 2B. The scanning lines 2, each made of a light blocking metal film such as chromium or the like, are formed at predetermined positions on the top face of the glass substrate 1. Gate electrodes 11 are formed at predetermined positions on the top faces of the scanning lines 2, and are severally formed in the neighborhood of the scanning lines 2 on the top face of the glass substrate 1 so as to cross with the scanning lines 2 at right angles (see FIG. 1). That is, one end portion of each of the gate electrodes 11 is formed on the top face of each of the scanning lines 2.

In this case, the gate electrodes 11 are formed with a transparent metal oxide containing n type or p type impurities. As the transparent metal oxide, for example, zinc oxide, magnesium zinc oxide, cadmium zinc oxide and the like can be cited. As the n type impurities, for example, phosphorus, arsenic, antimony and the like can be cited. As the p type impurities, for example, boron, aluminum, gallium, indium and the like can be cited.

As the forming method of the gate electrodes 11 and the scanning lines 2, a method of forming a film by a sputtering method using a metal oxide film including the n type or the p type impurities mentioned above as a target to pattern the formed film by using a photolithography technique is recommended. In the respects of electric field mobility, the stability of characteristics, and workability, the n type metal oxide film is generally suitable. However, because the n type metal oxide film is a depletion type metal oxide film and the leakage current thereof is large, the p type metal oxide film can be also used in case of regarding being low power consumption, but the use of the p type metal oxide film does not mean that the metal oxide film to be used for the formation of the gate electrodes 11 and the scanning lines 2 is limited to the p type metal oxide film.

A gate insulating film 12 made of silicon nitride is formed on the top face of the glass substrate 1 having the scanning lines 2 and the gate electrodes 11 thereon. Semiconductor thin films 13, which severally have a band gap of 2.5 V or higher and are severally made of one of the transparent and intrinsic metal oxides mentioned above, are formed on the top face of the gate insulating film 12 on the gate electrodes 11. Because the semiconductor thin films 13 severally having a wide band gap of 2.5 V or higher do not absorb any visible light, the semiconductor thin films 13 do not leak any light, and do not need light blocking consequently. Channel protecting films 14, which are made of silicon nitride, are formed at almost the central parts of the top faces of the semiconductor thin films 13.

Each of the data lines 3 is formed between corresponding two of the pixel electrodes 4 on the gate insulating film 12. The width of each of the data lines 3 is narrower than the gap of the two pixel electrodes 4. The data lines 3 are formed with a metal film having a light blocking property and a sufficiently small resistance value such as aluminum, chromium or the like.

A source electrode 15 and a drain electrode 16, both made of a transparent n type metal oxide, are formed on both the sides of the top face of each of the channel protecting films 14, and on the top face of a corresponding semiconductor thin film 13 on both the sides of the channel protecting film 14. The materials of the metal oxide and the n type impurities are the same as those in case of the gate electrodes 11. The drain electrode 16 is formed to be extended so as to cross with the corresponding data line 3 at right angles so that the end of the extended portion is overlapped on the data line 3 (see FIG. 1). The source electrodes 15 and the drain electrodes 16 are formed by the method of forming a film by the sputtering method using an n type metal oxide film as a target to pattern the source electrodes 15 and the drain electrodes 16 by using the photolithography technique similarly to the case of forming the gate electrodes 11.

Here, each of the thin film transistors 5 is composed of the gate electrode 11, the gate insulating film 12, the semiconductor thin film 13, the channel protecting film 14, the source electrode 15 and the drain electrode 16. In this case, because the gate electrode 11 is formed of the transparent p type metal oxide or the transparent n type metal oxide, and because the source electrode 15 and the drain electrode 16 are formed of the transparent n type metal oxide, the thin film transistor 5 has a structure which transmits light.

Overcoat films 17, each made of silicon nitride, are formed on the top face of the gate insulating film 12 having the thin film transistors 5 and the data lines 3 thereon. Contact holes 18 are formed at the portions of the overcoat films 17 corresponding to predetermined positions of the source electrodes 15. Pixel electrodes (electrodes for pixels) 4, which are made of a transparent electroconductive material such as ITO, are formed at predetermined positions of the overcoat films 17 to be electrically connected with the source electrodes 15 through the contact holes 18. In this case, each of the pixel electrodes 4 is formed to cover almost the whole of each of the thin film transistors 5.

As described above, because in the thin film transistor panel each of the thin film transistors 5 has the structure transmitting light and almost the whole of the thin film transistor 5 is covered with each of the pixel electrodes 4, all the area of the pixel electrode 4 including the thin film transistor 5 is a transmitting region, and the opening ratio of the pixel can be enlarged. In this case, although light enters the semiconductor thin film 13, which is made of the transparent intrinsic metal oxide mentioned above, of the thin film transistor 5, the semiconductor thin film 13 transmits the entered light as it is, and no problems are caused consequently.

Moreover, in the thin film transistor panel, because the scanning lines 2 and the data lines 3 are formed with the light blocking metal film such as the aluminum, the chromium or the like in place of a transparent metal oxide including impurities, the light leakage between the pixel electrodes 4 can be prevented, and the resistance value can be made to be sufficiently small.

Second Embodiment

Figure 3:
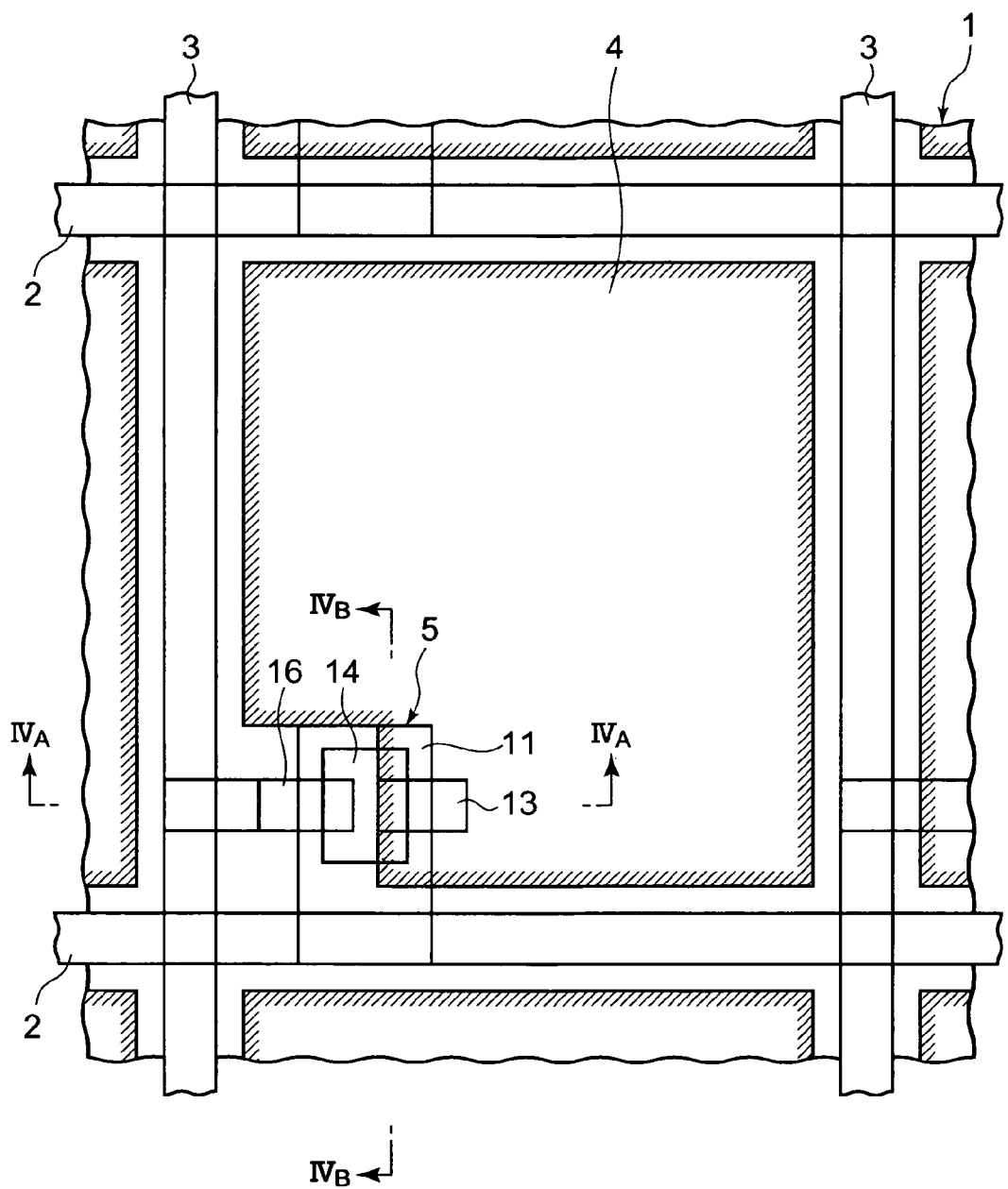
FIG. 3 is a plan view of the principal part of a thin film transistor panel in a liquid crystal display device as a second embodiment of the invention.
Figure 4A:
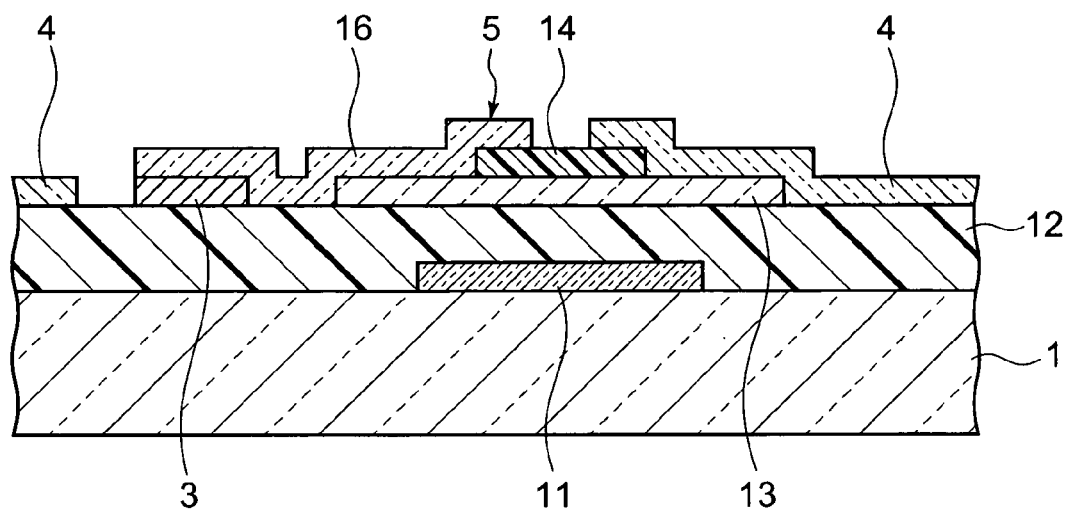
FIG. 4A is a sectional view taken along a line $IV_A$-$IV_A$ in FIG. 3.
Figure 4B:
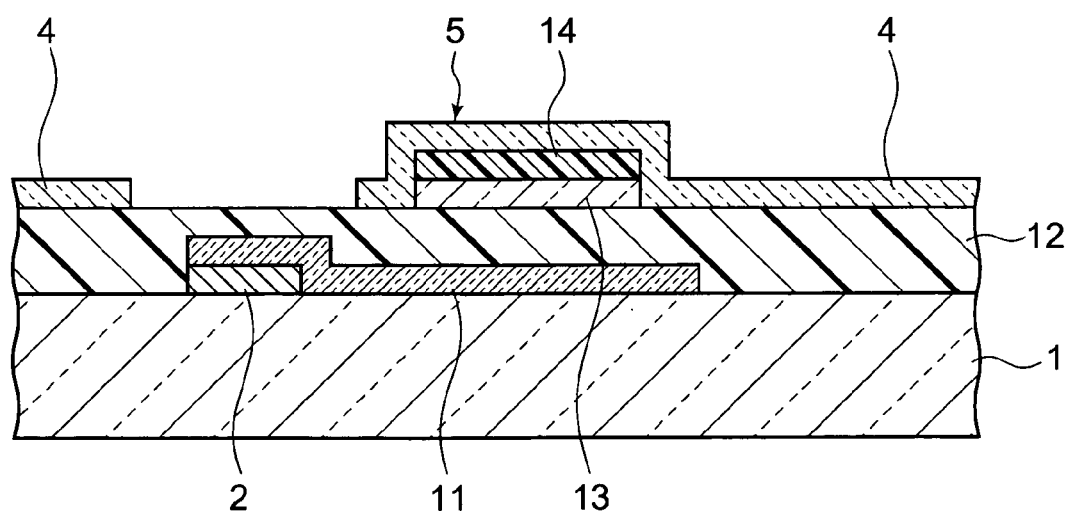
FIG. 4B is a sectional view taken along a line $IV_B$-$IV_B$ in FIG. 3.

FIG. 3 shows a plan view of the principal part of a thin film transistor panel in a liquid crystal display device as a second embodiment of the present invention. FIG. 4A shows a sectional view taken along a line $IV_A$-$IV_A$ in FIG. 3, and FIG. 4B shows a sectional view taken along a line $IV_B$-$IV_B$ in FIG. 3. Also in this case, with an object for clarifying FIG. 3, the edge portions of the pixel electrodes 4 are hatched by oblique short solid lines.

The thin film transistor panel is different from the thin film transistor panel shown in FIGS. 1, 2A and 2B in that the overcoat films 17 are omitted and each of the pixel electrodes 4 is formed with the n type metal oxide on one side of the top face of each of the channel protecting films 14, on the top face of each of the semiconductor thin films 13 on the external side of the channel protecting film 14, and at each of predetermined positions on the top face of the gate insulating film 12 to make a part of the pixel electrode 4 operate as a source electrode.

For manufacturing the thin film transistor panel, the method described with regard to the first embodiment is used. That is, the scanning lines 2, each made of a metal film having the light blocking property, and the gate electrodes 11, each made of a transparent p type or n type metal oxide film, are formed on the top face of the glass substrate 1. Next, the gate insulating film 12 is formed. On the gate insulating film 12, the semiconductor thin films 13, each made of a transparent intrinsic metal oxide, and the data lines 3, each made of a metal film having the light blocking property, are formed. The channel protecting films 14 are formed at almost the central parts on the top faces of the semiconductor thin films 13. Then, an n type metal oxide film is formed by the sputtering method, and the drain electrodes 16 and the pixel electrodes 4 are formed by the photolithographic method. However, at this time, the shapes of the pixel electrodes 4 are made to be ones integrating each of the source electrodes and each of the pixel electrodes to be one body.

In this case, because the pixel electrodes 4 are formed on the same surfaces as those of the drain electrodes 16, the planer shape of each of the pixel electrodes 4 is made to be one cut off at the corner part in the lower left of the pixel electrode in FIG. 3. But, because at least a portion of the pixel electrode 4 which functions as the source electrode, namely the portion formed on the corresponding channel protecting film 14 and the corresponding semiconductor thin film 13, covers a part of the corresponding gate electrode 11, the overlapping part of the pixel electrode 4 and the gate electrode 11 contributes to the opening ratio of the pixel. Consequently, the opening ratio can be enlarged. Moreover, the pixel electrodes 4 can be formed at the same process as those of the drain electrodes 16, and it is unnecessary to form the over coat films 17 and the contact holes 18 to enable to reduce the number of processes.

Third Embodiment

Figure 5A:
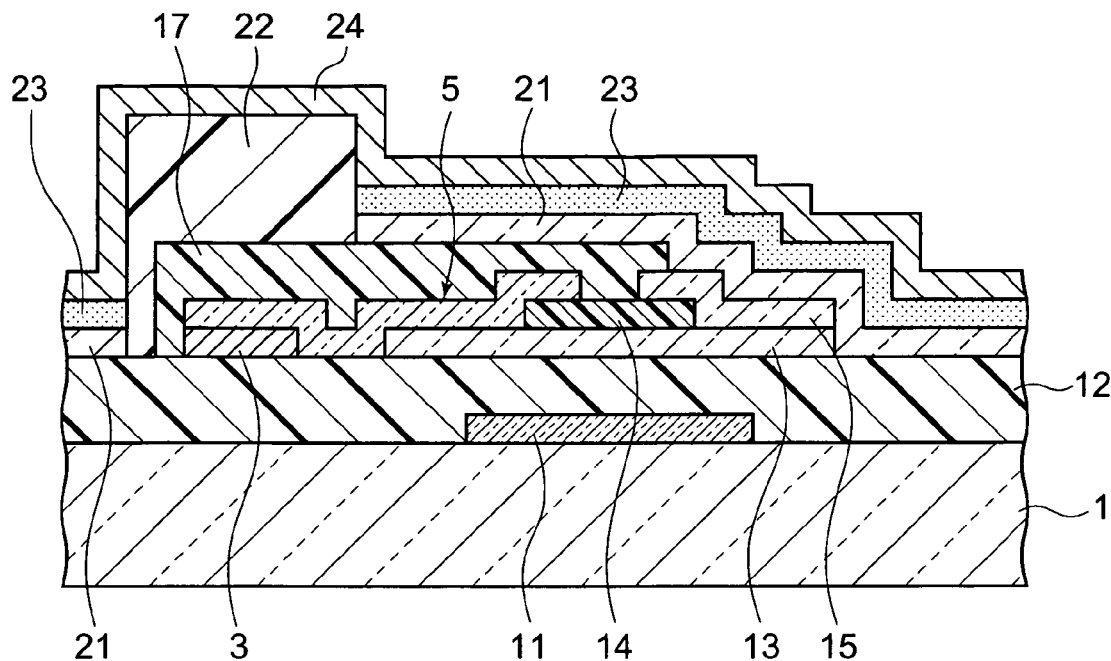
FIGS. 5A and 5B are sectional views of the principal part of an organic electroluminescence (EL) display device as a third embodiment of the invention.
Figure 5B:
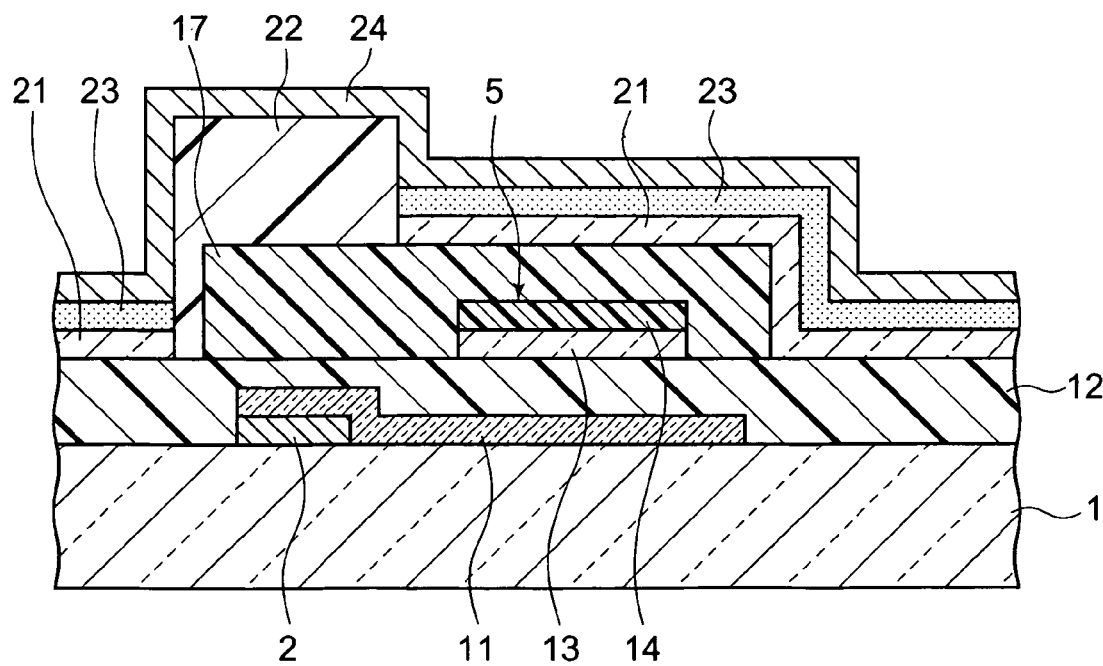

FIGS. 5A and 5B show the sectional views of the principal part of an organic electroluminescence (EL) display device as a third embodiment of the present invention. In the organic EL display device, the same constituent elements as those of the thin film transistor panel shown in FIGS. 2A and 2B are denoted by the same reference marks as those in FIGS. 2A and 2B, and their descriptions are omitted. In the organic EL display device, light emitting portions made of the organic EL are formed on the thin film transistors 5. That is, the organic EL display device is configured as follows. Only the portion of each of the thin film transistors 5 except the corresponding source electrode 15 is covered by the corresponding overcoat film 17. A corresponding anode electrode (an electrode for the pixel) 21 is formed on the source electrode 15, on a part of the overcoat film 17, and on the gate insulating film 12. A corresponding partition wall 22 made of polyimide or the like is formed at a predetermined position on the top face of the overcoat film 17 and the gate insulating film 12. A corresponding organic EL layer 23 is formed on the top face of the anode electrode 21 between the partition wall 22 and a partition wall 22 in an adjacent pixel. A cathode electrode 24 is formed on the top faces of the organic EL layers 23 and the partition walls 22.

In this case, the anode electrode 21 is formed so as to cover almost the whole portion of the thin film transistor 5. Moreover, the anode electrode 21 is formed with a transparent electroconductive material such as ITO or the like, and the cathode electrode 24 is formed with high reflexibility metal such as aluminum. In the configuration, because the light emitted from the organic EL layer 23 is reflected by the cathode electrode 24, which is formed on the organic EL layer 23, to be launched to the side of the glass substrate 1, the configuration is called as a bottom emission type. In such a bottom emission type organic EL display device, because the drain electrode 16, the source electrode 15, the semiconductor thin film 13 and the gate electrode 11 are formed with the transparent metal oxide films, and because the thin film transistor 5 transmits the light which has been emitted from the organic EL layer 23 and has been reflected by the cathode electrode 24, the whole region of the thin film transistor 5 becomes a light emitting region, and the opening ratio of the pixel can be enlarged.

Fourth Embodiment

Figure 6A:
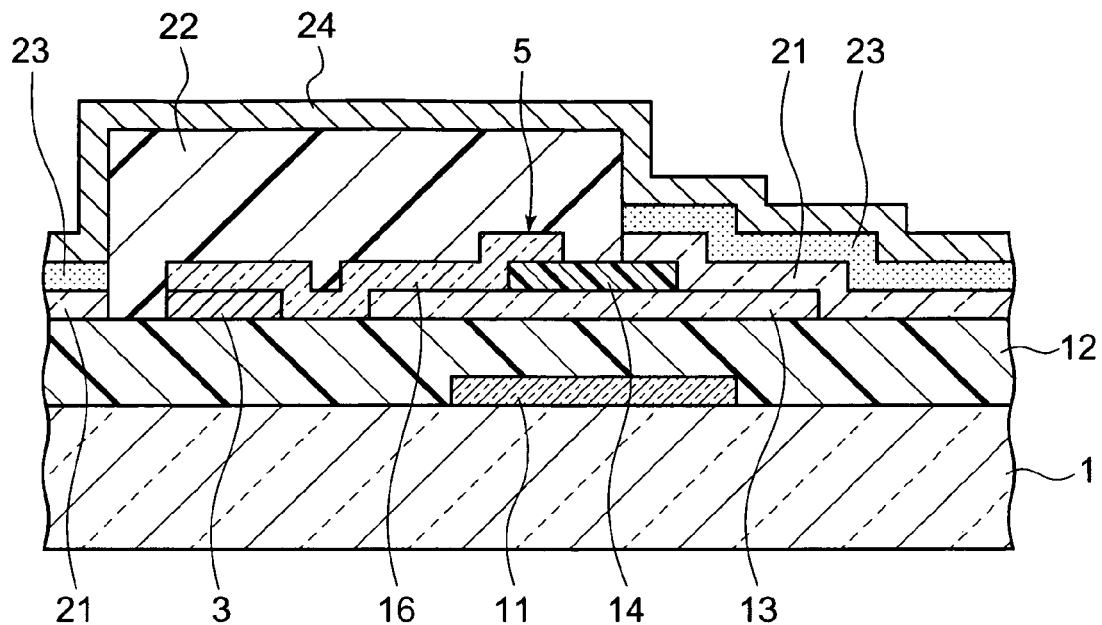
FIGS. 6A and 6B are sectional views of the principal part of an organic electroluminescence (EL) display device as a fourth embodiment of the invention.
Figure 6B:
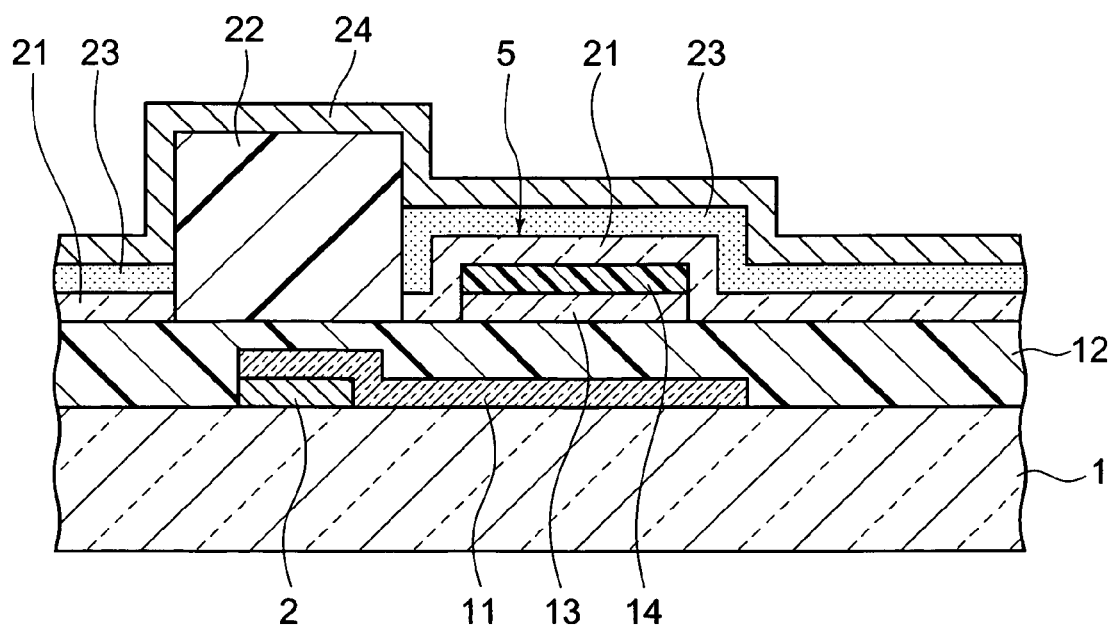

FIGS. 6A and 6B show the sectional views of the principal part of an organic EL display device as a fourth embodiment of the present invention. Each pixel of the organic EL display device is different from each pixel of the organic EL display device shown in FIGS. 5A and 5B in that the overcoat film 17 is omitted, and that the anode electrode 21 is formed with, for example, the transparent metal oxide including n type impurities on one side of the top face of the channel protecting film 14, on the top face of the semiconductor thin film 13 on the external side of the channel protecting film 14, and at a predetermined position on the top face of the gate insulating film 12 to make the anode electrode 21 operate also as a source electrode.

In this case, predetermined corner parts of the anode electrode 21, the organic EL layer 23 and the cathode electrode 24 are cut off similarly to the case of cutting off the pixel electrode 4 at the corner part in the lower left of the pixel electrode 4 in FIG. 3 because the anode electrode 21 is formed on the same surface as that of the drain electrode 16. However, because at least the portion of the anode electrode 21 which functions as the source electrode, namely the portion formed on the channel protecting film 14 and the semiconductor thin film 13, covers a part of the gate electrode 11, the overlapping portion of the anode electrode 21 and the gate electrode 11 contributes to the opening ratio of the pixel, and consequently the opening ratio can be enlarged. Moreover, the anode electrode 21 can be formed at the same process as that of the drain electrode 16, and consequently the number of processes can be reduced.

Other Embodiments

Although one end portion of each of the gate electrodes 11 and one end portion of each of the drain electrodes 16, both made of the metal oxide containing, for example, the n type impurities, are formed on each top face of the corresponding scanning line 2 and the corresponding data line 3, respectively, in, for example, FIGS. 1, 2A and 2B, the present invention is not limited to such a configuration. The metal oxide film containing, for example, the n type impurities may be formed, for example, on the whole of each top face of the scanning line 2 and the data line 3. Moreover, the scanning line 2 and the data line 3 may be formed on the top face of each one end portion of the gate electrode 11 and the drain electrode 16. In this case, the metal oxide film including, for example, the n type impurities may be formed on the whole of each under surface of the scanning line 2 and the data line 3.

Moreover, in the case of the organic EL display panel, two thin film transistors may be formed in a pixel, which is composed of a group of one of the anode electrodes 21, one of the organic EL layers 23 and the cathode electrode 24 (see, for example, JP 2004-171882 A). Moreover, three thin film transistors may be formed in one pixel (see, for example, JP 2003-195810 A).

According to the present invention, because at least a part of the gate electrode of a thin film transistor is covered by an electrode for a pixel as the structure of the thin film transistor which transmits light in each pixel, the overlapping portion of the gate electrode of the thin film transistor and the electrode for the pixel contributes to the opening ratio of the pixel, and consequently the opening ratio can be enlarged.

The entire disclosure of Japanese Patent Application No. 2005-054403 which was filed on Feb. 28, 2005, including specification, claims, drawings and abstract, is incorporated into the present invention in its entirety.

What is claimed is:

1. A thin film transistor panel comprising:
a transparent substrate;
scanning lines which are made of a light blocking electroconductive material, and which are formed on the transparent substrate;
data lines which are formed on the transparent substrate perpendicular to the scanning lines, and which are made of the light blocking electroconductive material;
thin film transistors each including: (i) a transparent gate electrode, a part of which overlaps one of the scanning lines so as to be electrically connected to the one of the scanning lines, (ii) a transparent drain electrode, a part of which overlaps one of the data lines so as to be electrically connected to the one of the data lines, (iii) a transparent source electrode, and (iv) a transparent metal oxide semiconductor thin film;
transparent pixel electrodes which are formed with a transparent metal oxide as anode electrodes, and which are electrically connected to the source electrode; and
an organic EL layer and a cathode electrode which are formed in a region corresponding to each of the anode electrodes,
wherein each of the pixel electrodes covers at least a part of the gate electrode so as to avoid a region where the gate electrode overlaps the one of the scanning lines, and the pixel electrodes also function as the source electrodes.

2. The thin film transistor panel according to claim 1, wherein the pixel electrodes are formed to cover the semiconductor thin film.

3. The thin film transistor panel according to claim 1, wherein each of the anode electrodes, the organic EL layers and the cathode electrode are laminated in order from a lower layer side.

4. The thin film transistor panel according to claim 3, wherein the cathode electrode is a reflecting electrode.

5. The thin film transistor panel according to claim 1, wherein a transparent metal oxide film is formed on at least one of a top face and a bottom face of the scanning lines and the data lines.

6. A thin film transistor panel comprising:
a transparent substrate;
scanning lines which are made of a light blocking electroconductive material, and which are formed on the transparent substrate;
data lines which are formed on the transparent substrate perpendicular to the scanning lines, and which are made of the light blocking electroconductive material;
thin film transistors each including: (i) a transparent gate electrode, a part of which overlaps one of the scanning lines so as to be electrically connected to the one of the scanning lines, (ii) a transparent drain electrode, a part of which overlaps one of the data lines so as to be electrically connected to the one of the data lines, (iii) a transparent source electrode, and (iv) a transparent metal oxide semiconductor thin film; and
transparent pixel electrodes which are electrically connected to the source electrode,
wherein each of the thin film transistors includes a channel protecting film,
wherein each of the pixel electrodes is located to cover all of a region where the gate electrode overlaps with the channel protecting film, and to avoid a region where the gate electrode overlaps the one of the scanning lines.

7. The thin film transistor panel according to claim 6, wherein the drain electrode, the source electrode and the gate electrode of each of the thin film transistors are made of a metal oxide including impurities.

8. The thin film transistor panel according to claim 7, wherein the drain electrode and the source electrode are formed on the semiconductor thin film.

9. The thin film transistor panel according to claim 7, wherein the gate electrode of each of the thin film transistors is formed with a metal oxide including p type impurities.

10. The thin film transistor panel according to claim 6, wherein the transparent pixel electrodes are formed with a transparent metal oxide and the transparent pixel electrodes also function as the source electrodes.

11. The thin film transistor panel according to claim 6, further comprising:
an overcoat film formed on the source electrode; and
wherein each of the pixel electrodes is electrically connected to the source electrode through a contact hole that is formed in the overcoat film.

* * * * *